(12) United States Patent
Sugiura et al.

(10) Patent No.: US 10,895,602 B2
(45) Date of Patent: Jan. 19, 2021

(54) BATTERY ASSEMBLY STATE ESTIMATION DEVICE AND BATTERY ASSEMBLY STATE ESTIMATION METHOD

(71) Applicant: PRIMEARTH EV ENERGY CO., LTD., Kosai (JP)

(72) Inventors: Yosuke Sugiura, Toyohashi (JP); Naoshi Akamine, Okazaki (JP)

(73) Assignee: PRIMEARTH EV ENERGY CO., LTD., Kosai (JP)

( * ) Notice: Subject to any disclaimer, the term of this patent is extended or adjusted under 35 U.S.C. 154(b) by 227 days.

(21) Appl. No.: 16/256,284

(22) Filed: Jan. 24, 2019

(65) Prior Publication Data

US 2019/0235027 A1 Aug. 1, 2019

(30) Foreign Application Priority Data

Jan. 30, 2018 (JP) .................................. 2018-014009

(51) Int. Cl.
| | |
|---|---|
| *G01R 31/367* | (2019.01) |
| *G01R 31/3842* | (2019.01) |
| *G01R 31/36* | (2020.01) |
| *H01M 10/48* | (2006.01) |
| *G01R 31/396* | (2019.01) |
| *H01M 10/42* | (2006.01) |

(52) U.S. Cl.
CPC ....... *G01R 31/367* (2019.01); *G01R 31/3648* (2013.01); *G01R 31/3842* (2019.01); *G01R 31/396* (2019.01); *H01M 10/425* (2013.01); *H01M 10/482* (2013.01); *H01M 10/486* (2013.01); *H01M 2220/20* (2013.01)

(58) Field of Classification Search
None
See application file for complete search history.

(56) References Cited

U.S. PATENT DOCUMENTS 6,205,656 B1 * 3/2001 Adams ................... H02S 40/38
29/840
2002/0174981 A1 * 11/2002 Den Boer ............ E21B 34/066
166/66.5

(Continued)

FOREIGN PATENT DOCUMENTS

| CN | 105208884 | * | 11/2017 | ........... F24H 9/0005 |
| CN | 107571784 | * | 1/2018 | ............... B60P 3/00 |

(Continued)

*Primary Examiner* — Tung S Lau
(74) *Attorney, Agent, or Firm* — Maschoff Brennan

(57) ABSTRACT

A state estimation device for a battery assembly including rechargeable batteries acquires battery information of each rechargeable battery, stores a battery model of the battery assembly including the battery information of a rechargeable battery, and estimates a battery state of the battery assembly based on the battery information of each rechargeable battery and the battery model. The state estimation unit estimates the battery state of the battery assembly based on the battery information of each rechargeable battery, uses the estimated battery states of the battery assembly as a state variable, and applies an optimum filter for performing optimization based on a distribution of a plurality of sample points to a state equation and an output equation included in the battery model to calculate a gain for correcting the state variable.

11 Claims, 5 Drawing Sheets

(56) References Cited

U.S. PATENT DOCUMENTS

| | | | | |
|---|---|---|---|---|
| 2003/0117728 | A1* | 6/2003 | Hutzel | H04N 7/181 |
| | | | | 359/838 |
| 2009/0129067 | A1* | 5/2009 | Fan | F21V 23/0435 |
| | | | | 362/183 |
| 2012/0100923 | A1* | 4/2012 | Davenport | A63B 24/0006 |
| | | | | 473/223 |
| 2015/0260800 | A1 | 9/2015 | Baba et al. | |
| 2016/0355093 | A1* | 12/2016 | Konet | H02J 50/90 |
| 2016/0355097 | A1* | 12/2016 | Konet | B60L 11/1831 |
| 2020/0153284 | A1* | 5/2020 | Shi | H02J 7/0013 |

FOREIGN PATENT DOCUMENTS

| | | | | |
|---|---|---|---|---|
| CN | 107799111 | * | 3/2018 | G10K 11/178 |
| CN | 207290177 | * | 5/2018 | B26B 19/38 |
| FR | 2862558 | * | 5/2005 | H02J 7/0013 |
| JP | 2014-074682 A | | 4/2014 | |
| WO | WO 2014112982 | * | 7/2014 | H04R 25/30 |
| WO | WO 2014137319 | * | 9/2014 | H04R 25/556 |

* cited by examiner

BATTERY ASSEMBLY STATE ESTIMATION DEVICE AND BATTERY ASSEMBLY STATE ESTIMATION METHOD

CROSS-REFERENCE TO RELATED APPLICATIONS

This application is based upon and claims the benefit of priority from prior Japanese Patent Application No. 2018-014009, filed on Jan. 30, 2018, the entire contents of which are incorporated herein by reference.

BACKGROUND ART

The present invention relates to a battery assembly state estimation device and a battery assembly state estimation method for estimating a battery state of a battery assembly.

Japanese Laid-Open Patent Publication No. 2014-74682 describes a state estimation device for estimating a state of charge (SOC), which is one of the battery states of a rechargeable battery, using a Kalman filter.

The state estimation device described in Japanese Laid-Open Patent Publication No. 2014-74682 includes an equivalent circuit model of a rechargeable battery (battery), a logarithmic transform parameter value estimation unit, and an inverse logarithmic transform unit. The equivalent circuit model of the battery includes a Foster type RC ladder circuit, a Cowell type RC ladder circuit, or the like. The logarithmic transform parameter value estimation unit has a Kalman filter that adjusts the battery equivalent circuit model to be close to an actual system. The battery equivalent circuit model uses a logarithmic transform parameter value as a state variable. The logarithmic transform parameter value is acquired by logarithmically transforming the parameter. The state estimation device successively estimates a logarithmic transform parameter value of the battery equivalent circuit model and an open voltage of the battery based on a terminal voltage from a voltage sensor and a charge/discharge current from a current sensor. The inverse logarithmic transform unit receives the logarithmic transform parameter value of the battery equivalent circuit model from the logarithmic transform parameter value estimation unit, performs inverse logarithmic transform, and acquires a parameter as an antilogarithm corresponding to the logarithmic transform parameter value inversely logarithmically transformed.

In the technique described in Japanese Laid-Open Patent Publication No. 2014-74682, the rechargeable battery state is estimated using the Kalman filter.

A battery assembly is employed as a power device of an electric vehicle, a hybrid vehicle, or the like. It is highly convenient to evaluate the battery state on a battery assembly basis. However, if a total electric current or a total voltage of the battery assembly is evaluated by considering the entire battery assembly as a single rechargeable battery, the effect of each rechargeable battery included in the battery assembly may be incorrectly evaluated. When each battery state of a plurality of rechargeable batteries included in the battery assembly is evaluated, the rechargeable batteries may be collectively estimated as the battery state of the battery assembly. This may increase the computation load.

SUMMARY OF THE INVENTION

One aspect of the present invention is a state estimation device for a battery assembly including a plurality of rechargeable batteries. The state estimation device includes a battery information acquiring unit configured to acquire battery information of each of the rechargeable batteries, a memory configured to store a battery model of the battery assembly including the battery information of a rechargeable battery, and a battery state estimation unit configured to estimate a battery state of the battery assembly based on the battery information of each of the rechargeable batteries acquired by the battery information acquiring unit and the battery model of the battery assembly. The battery state estimation unit receives the battery information of each of the rechargeable batteries acquired by the battery information acquiring unit. The battery state estimation unit estimates the battery state of the battery assembly based on the received battery information of each of the rechargeable batteries. The battery state estimation unit uses the estimated battery states of the battery assembly as a state variable and applies an optimum filter for performing optimization based on a distribution of a plurality of sample points to a state equation and an output equation included in the battery model to calculate a gain for correcting the state variable. The battery state estimation unit successively estimates the battery state of the battery assembly using the calculated gain. Each of the sample points is associated with one of the rechargeable batteries and allocated the battery state of the battery assembly estimated from the battery information of the associated rechargeable battery.

A further aspect of the present invention is a method for estimating a state of a battery assembly including a plurality of rechargeable batteries. The method includes acquiring battery information of each of the rechargeable batteries from the rechargeable batteries with a battery information acquiring unit, storing a battery model of the battery assembly including the battery information of a rechargeable battery in a memory, and estimating a battery state of the battery assembly based on the battery information of each of the rechargeable batteries, which is acquired by the battery information acquiring unit, and the battery model of the battery assembly with a battery state estimation unit. The estimating a battery state of the battery assembly includes receiving the battery information of each of the rechargeable batteries acquired by the battery information acquiring unit, estimating the battery state of the battery assembly based on the received battery information of each of the rechargeable batteries, using the estimated battery states of the battery assembly as a state variable and applying an optimum filter for performing optimization based on a distribution of a plurality of sample points to a state equation and an output equation included in the battery model to calculate a gain for correcting the state variable, and successively estimating the battery state of the battery assembly with the calculated gain. Each of the sample points is associated with one of the rechargeable batteries and allocated the battery state of the battery assembly estimated from the battery information of the associated rechargeable battery.

Other aspects and advantages of the present invention will become apparent from the following description, taken in conjunction with the accompanying drawings, illustrating by way of example the principles of the invention.

DETAILED DESCRIPTION OF THE EMBODIMENTS

A battery assembly state estimation device and a battery assembly state estimation method according to an embodiment of the present invention will now be described with reference to FIGS. 1 to 8.

Figure 1:
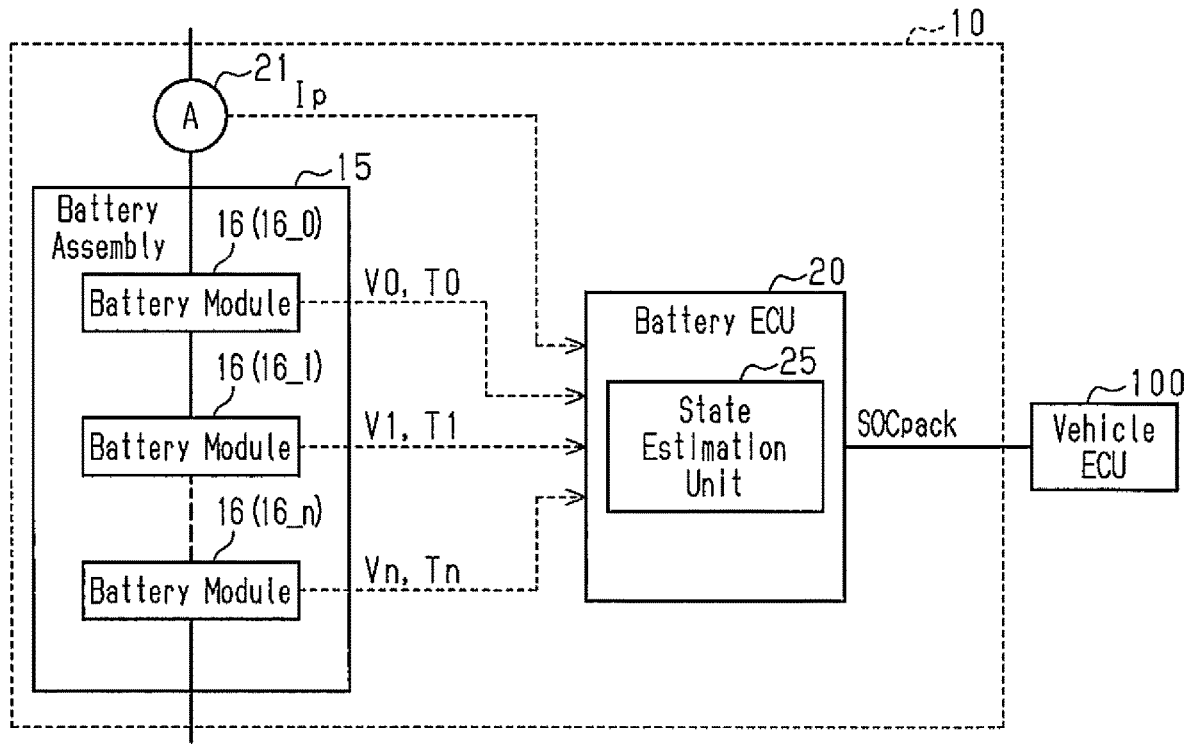
FIG. 1 is a schematic block diagram illustrating the configuration of a battery assembly state estimation device according to one embodiment of the present invention.

As illustrated in FIG. 1, a battery pack 10 mounted on a vehicle such as a hybrid vehicle includes a battery assembly 15 and a battery ECU 20 serving as a battery assembly state estimation device for estimating a battery state of the battery assembly 15. The battery ECU 20 includes a state estimation unit 25 that estimates the battery state of the battery assembly 15. The battery assembly 15 includes battery modules 16_0 to 16_n connected in series to one another to serve as a plurality of rechargeable batteries. Here, "n" represents an integer equal to or greater than "1", and the number of battery modules is set to "n+1" from the "zeroth" to the nth battery modules. In the following description, in a case where there is no need to distinguish the battery modules 16_0 to 16_n from one another, they will be simply referred to as a "battery module 16". For example, the type of the battery module 16 is a nickel-metal hydride rechargeable battery or a lithium-ion rechargeable battery, and the battery module 16 is a box-shaped sealed battery. The battery assembly 15 has a longitudinal direction aligned in a direction in which a plurality of battery modules 16 are stacked (hereinafter referred to as the "stacking direction").

The state estimation unit 25 acquires battery information of each of a plurality of battery modules 16. The battery information is information including at least one of current, voltage, and temperature. For example, the state estimation unit 25 acquires information containing a voltage V0 and a temperature T0 from the zeroth battery module 16_0, acquires information containing a voltage V1 and a temperature T1 from the first battery module 16_1, and acquires information containing a voltage Vn and a temperature Tn from the nth battery module 16_n. In addition, the state estimation unit 25 acquires information containing the current input to or output from the battery assembly 15 using a current measurement unit 22, that is, an input/output current Ip input to or output from the battery modules 16. Here, "n" refers to a total number of a plurality of battery modules 16 of the battery assembly 15 minus one (total number−1) and represents an integer equal to or greater than "2". Therefore, the total number of battery modules 16 is "n+1", and the battery module 16 corresponding to "n=0" and the battery module 16 corresponding to "n≥1" are discriminated as necessary in computation.

The state estimation unit 25 estimates a battery state of the battery assembly 15 based on a plurality of voltages V0, V1, V2, . . . , and Vn, a plurality of temperatures T0, T1, T2, . . . , and Tn, and the input/output current Ip. According to this embodiment, a state of charge (SOC) of the battery assembly 15 is estimated as one of the battery states. The state estimation unit 25 outputs the estimated state of charge SOCpack of the battery assembly 15 to the vehicle ECU 100 or the like.

According to this embodiment, the battery state is the state of charge (SOC: %). In addition, the state of charge SOC includes a state of charge of the battery assembly 15 "SOCpack", states of charge of the battery modules 16_0 to 16_n "SOCM0 to SOCMn", and states of charge of the battery assembly 15 "SOC0 to SOCn". The states of charge SOC0 to SOCn of the battery assembly 15 are estimated from the battery information (voltages V0 to Vn) of the corresponding battery modules 16_0 to 16_n. For example, the state of charge SOC0 of the battery assembly 15 is estimated from the battery information (voltage V0) of the battery module 16_0. In addition, the state of charge SOCM of each battery module 16 has a correlation with the state of charge SOC of the battery assembly 15 estimated from the voltage of the corresponding battery module 16.

Figure 2:
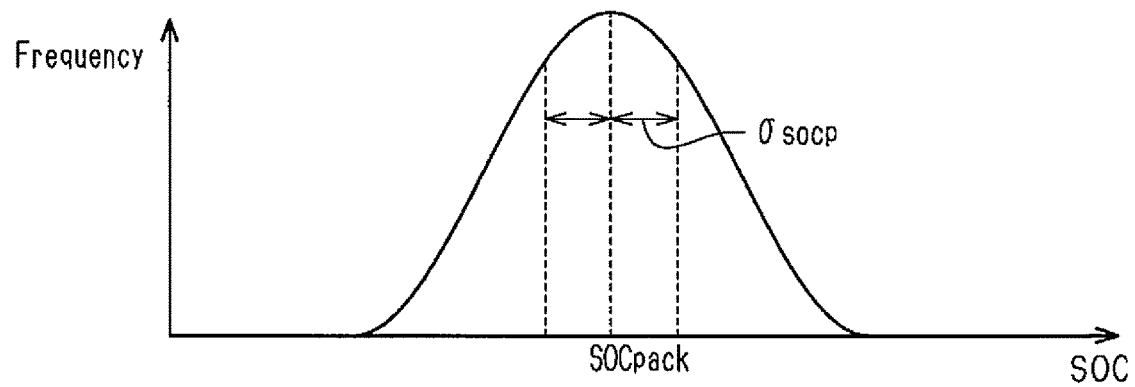
FIG. 2 is a graph illustrating the SOC distribution of battery modules according to the embodiment.

FIG. 2 illustrates a normal distribution of the state of charge of the battery assembly 15 according to this embodiment. The state of charge SOCpack of the battery assembly 15 corresponds to a mode in a distribution of the "n+1" states of charge SOC0 to SOCn of the battery assembly 15. A standard deviation σsocp is a standard deviation when the battery assembly 15 has a state of charge SOCpack. The states of charge SOC0 to SOCn of the battery assembly 15 are respectively correlated with the states of charge SOCM0 to SOCMn of the battery modules 16_0 to 16_n. For this reason, if the (n+1) states of charge SOC0 to SOCn of the battery assembly 15 are included in the standard deviation σsocp, it is conceived that a variation in the states of charge SOCM0 to SOCMn of battery modules 16 are also reduced. Although the standard deviation σsocp is preferably set to "+/−1σ", it may be set to either "+/−2σ" or "+/−3σ".

Referring to FIG. 1, the state estimation unit 25 estimates the state of charge SOC of the battery assembly 15 using an optimum filter. According to this embodiment, the optimum filter is an unscented Kalman filter (UKF) as a nonlinear Kalman filter. The state estimation unit 25 generally sets, for the UKF, a single average value (representative value) and a plurality of sigma points as a plurality of sample points defined from the standard deviation. In general, a plurality of sigma points include a representative value and a sample point slightly deviated from the representative value and defined in a probability distribution of the state.

According to this embodiment, the state estimation unit 25 allocates the states of charge SOC0 to SOCn of the battery assembly 15 as a battery state to a plurality of sigma points for the UKF. A single sigma point is set as the representative value instead of the general representative value described above. That is, according to this embodiment, the state of charge SOC0 of the battery assembly 15 calculated based on the battery information of the zeroth battery module 16_0 is set as the sigma point and the representative value. The states of charge SOC1 to SOCn of the battery assembly 15 calculated based on the battery information of the first to nth battery modules 16_1 to 16_n are set as the sigma points. Typically, it is expected that the states of charge SOC0 to SOCn of the battery assembly 15 for a plurality of battery modules 16_0 to 16_n included in the battery assembly 15 are within a predetermined error range. Therefore, there is no particular constraint in setting of the states of charge SOC0 to SOCn of the battery assembly 15 based on a plurality of battery modules 16_0 to 16_n, respectively, as a plurality of sigma points set in the UKF.

Figure 3:
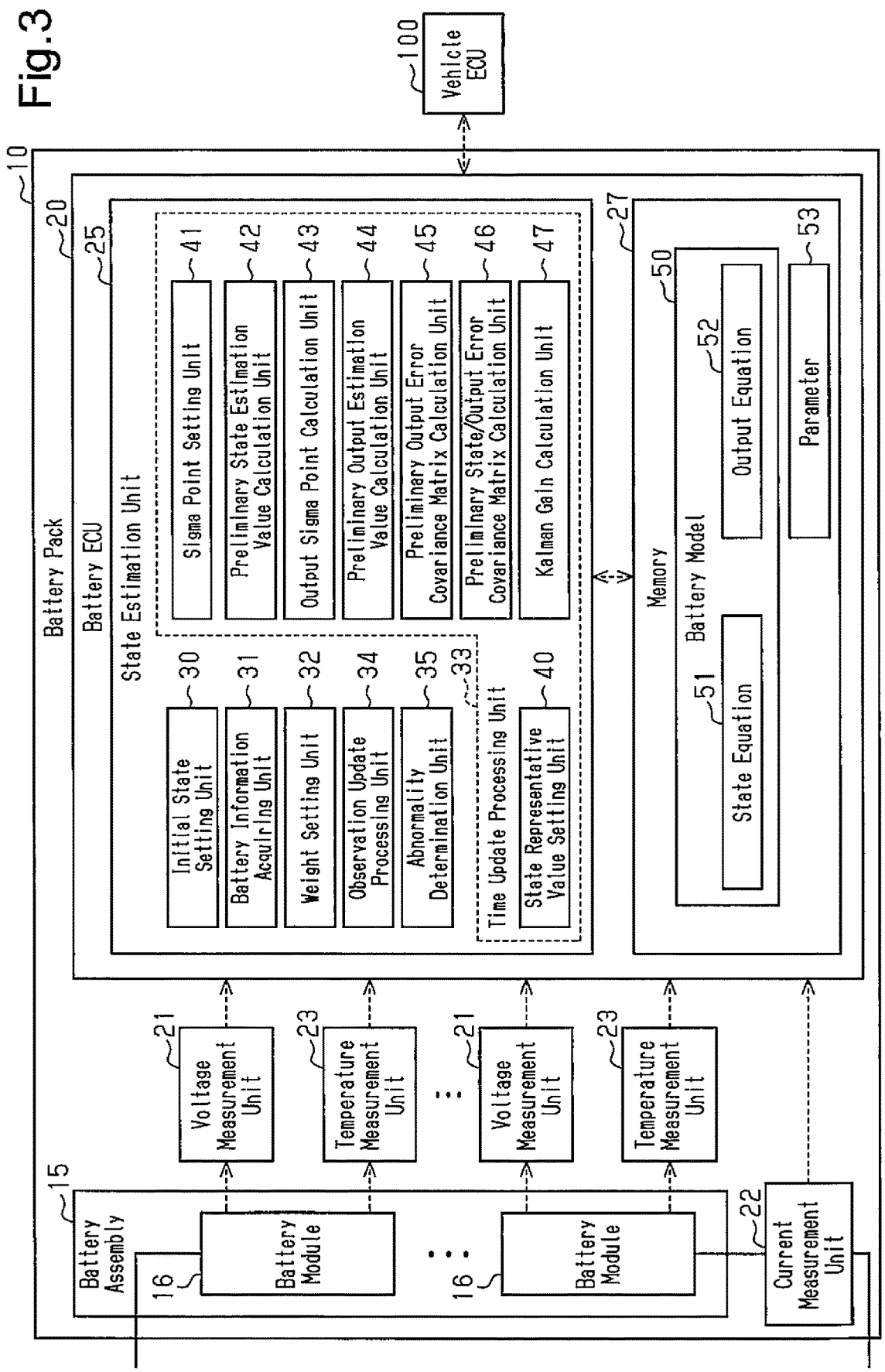
FIG. 3 is a block diagram illustrating the configuration of a state estimation device according to the embodiment.

The battery pack 10 will be described in detail with respect to FIG. 3.

The battery ECU 20 acquires a current value of the input/output current Ip of the battery assembly 15 measured by the current measurement unit 22. In addition, the battery ECU 20 acquires voltage values of the voltages V0 to Vn of the battery modules 16 measured by a plurality of voltage measurement units 21, and acquires temperatures T0 to Tn of the battery modules 16 measured by a plurality of temperature measurement units 23.

The battery ECU 20 includes a microcomputer. The battery ECU 20 has a computation device and a memory 27. The state estimation unit 25 of the battery ECU 20 estimates the state of charge SOC. The state estimation unit 25 performs a computation process by executing a program for estimating the battery state to provide a state estimation function.

The memory 27 stores a battery model 50, which is a mathematical expression model of the battery assembly 15, and a parameter 53. The battery model 50 has a state equation 51 in which the battery state of the battery assembly 15 is used as a state variable and an output equation 52 representing an output based on the state variable.

The parameter 53 may include internal resistances or induced voltages of a plurality of battery modules 16.

The state equation 51 is a nonlinear function. Here, "x" represents a state vector, and "u" represents an input vector. The state equation 51 is set as expressed in Equation (1). In addition, the output equation 52 is a nonlinear function and is set as expressed in Equation (2). The "timing k" refers to a sampling timing, and the "timing k−1" refers to a timing preceding the "timing k".

Equation 1

$$x(k)=f(x(k-1),u(k-1))+v_{k-1} \quad (1)$$

Equation 2

$$y(k)=h(x(k),u(k))+w_k \quad (2)$$

Here, variables or symbols in Equations (1) and (2) and the following equations are set as described below.

x(k): refers to a state variable (vector) at the timing k as a model value representing a battery state of the battery assembly 15. According to this embodiment, the model value refers to states of charge SOC0 to SOCn corresponding to the battery assembly 15 estimated from the battery information of the battery modules 16.

u(k): refers to an input (vector) at the timing k and corresponds to one or more of the current, voltage, and temperature acquired by the battery information acquiring unit 31. According to this embodiment, the input is voltages V0 to Vn measured by a plurality of battery modules 16.

y(k): refers to an output (vector) at the timing k as an observation value calculated based on the battery state of the battery assembly 15. According to this embodiment, the output includes voltages V0 to Vn of the corresponding battery modules 16 respectively estimated from the estimated states of charge SOC0 to SOCn of the battery assembly 15.

$v_k$: corresponds to system noise and is set to match a variation of the state variable based on a modeling error and input noise of the battery model 50.

$w_k$: corresponds to observation noise and is set to match, for example, a measurement error of voltage, current, and temperature caused by the battery information acquiring unit 31 or the like.

The state estimation unit 25 receives voltage values of the voltages V0 to Vn acquired by the battery information acquiring unit 31 and estimates the states of charge SOC0 to SOCn of the battery assembly 15 based on the voltage values of voltages V0 to Vn. The state estimation unit 25 computes the state equation 51 and the output equation 52 included in the battery model 50 by using the states of charge SOC0 to SOCn of the battery assembly 15 as the state variable x(k) and estimates the state of charge SOCpack of the battery assembly 15. In addition, the state estimation unit 25 successively calculates the Kalman gain of the battery model 50 for the Kalman filter of the state estimation based on the acquired voltages V0 to Vn and the corresponding states of charge SOC0 to SOCn of the battery assembly 15 estimated from the battery modules 16.

The state estimation unit 25 includes an initial state setting unit 30 that performs a process necessary for estimating the state of charge SOCpack of the battery assembly 15, a battery information acquiring unit 31, a weight setting unit 32, a time update processing unit 33, an observation update processing unit 34, and an abnormality determination unit 35.

The initial state setting unit 30 sets an initial value x(0) of the state estimation value and an initial value P(0) of the state covariance before starting computation of the UKF. A suitable value is set in the initial value x(0) of the state estimation value as the state of charge SOCpack of the battery assembly 15. The initial value P(0) of the state covariance is set based on the initial value x(0) of the set state estimation value.

The battery information acquiring unit 31 successively acquires a current value of the input/output current Ip, voltage values of the voltages V0 to Vn, and the temperatures T0 to Tn of the battery modules 16 from the current measurement unit 22, the voltage measurement units 21, and the temperature measurement units 23.

The weight setting unit 32 sets a weight ωi applied to each sigma point based on a distribution of the estimated states of charge SOC0 to SOCn of the battery assembly 15. For example, the weight setting unit 32 may calculate the weight ωi applied to each sigma point based on the distribution of the battery information (such as current, voltage, or temperature) acquired from the battery assembly 15 or estimated. That is, by setting a heavy weight ωi for a state strongly indicating influence of the battery information (such as current, voltage, or temperature) where an abnormality or the like is to be detected, it is possible to obtain a result of state estimation focusing on influence of the battery information having a heavy weight ωi. For example, a plurality of weights ωi applied to a plurality of sigma points are set such that a total sum of the weights ωi is "1". For example, the weight ωi may be set by measuring a plurality of pieces of battery information, selecting interested battery information from the plurality of pieces of battery information, and emphasizing the selected battery information. In addition, a plurality of weights ωi may be set equivalently for all the weights ωi. In this case, the battery state or the battery information added in consideration of the weight is obtained as a so-called average value. For example, by setting the weight ωi based on the state set to regulate battery performance of the battery assembly, an estimation result focusing on the state of regulating the battery performance is obtained.

The time update processing unit 33 computes the UKF. In the computation of the UKF, the state equation 51 and the output equation 52 of the battery model 50 are used by updating the timing k.

The observation update processing unit 34 updates the state variable based on a preliminary state variable, a difference between an observation value of the output and a preliminary estimation value, and the Kalman gain.

The abnormality determination unit 35 serving as a variation determination unit determines a variation in the distribution of the battery states of a plurality of battery modules 16. For example, the abnormality determination unit 35 determines a magnitude of the variation by comparing the Kalman gain calculated by the time update processing unit 33 with a first variation determination value for determining the variation. For example, the abnormality determination unit 35 calculates an error covariance matrix and compares the calculated error covariance matrix with a second variation determination value for determining the variation to determine the magnitude of the variation.

The time update processing unit 33 will now be described in detail.

To perform the UKF computation, the time update processing unit 33 includes a state representative value setting unit 40, a sigma point setting unit 41, a preliminary state estimation value calculation unit 42, an output sigma point calculation unit 43, a preliminary output estimation value calculation unit 44, a preliminary output error covariance matrix calculation unit 45, a preliminary state/output error covariance matrix calculation unit 46, and a Kalman gain calculation unit 47.

The state representative value setting unit 40 sets, as the representative value, a state of charge SOC0 of the battery assembly 15 calculated from the voltage of the battery module 16_0, which is a selected one from the battery modules 16. A variation in the state variable (states of charge SOC1 to SOCn of the battery assembly 15) calculated from the voltages V1 to Vn of the other battery modules 16_1 to 16_$n$ is determined for the representative value.

The sigma point setting unit 41 sets the sigma points other than the representative value around the representative value as sample points of the state variable distribution.

In general, the sigma point may be automatically defined as an average and a standard deviation of the distribution as expressed in Equations (3) and (4).

Equation 3

$$\sigma_0(k-1) = \hat{x}(k-1) \quad (3)$$

Equation 4

$$\sigma_i(k-1) = \hat{x}(k-1) \pm \sqrt{nx+r}(\sqrt{P(k-1)})_i, \; i=1,2,3,\ldots,n \quad (4)$$

Here, variables or symbols in Equations (3) and (4) and the following equations are defined as described below.

$nx$: refers to the number of elements of $x(k)$ and is an integer equal to or greater than "1".

$r$: refers to a scaling parameter representing how far the value is employed from the average sigma point $\sigma_0$. Here, the average sigma point is the representative value.

A circumflex "^" indicates that a value such as the variable is an estimation value.

An overline "‾" indicates that a value such as the variable is an estimation value prior to the updating.

$P(k)$: refers to a covariance matrix at the timing k.

$\sigma_i(k)$: refers to a sigma point at the timing k. According to this embodiment, voltages V1 to Vn are estimated from a plurality of battery modules 16. The corresponding states of charge SOC1 to SOCn of the battery assembly 15 are estimated and set based on respective voltages V1 to Vn.

$\omega_i$: refers to a weight of a value (refer to Equation (9)). The value of $\omega_i$ is set according to the corresponding states of charge SOC0 to SOCn of the battery assembly 15 estimated based on respective battery modules 16.

According to the present invention, the sigma point setting unit 41 sets, as a representative value, the state of charge SOC0 of the battery assembly 15 estimated from the voltage V0 of the selected battery module 16_0. The states of charge SOC1 to SOCn of the battery assembly 15 respectively estimated from the voltages V1 to Vn of the other battery modules 16 are regarded as being around the representative value. The states of charge SOC1 to SOCn of the battery assembly 15 respectively estimated from the voltages V1 to Vn of the other battery modules 16 are set as the sigma points.

The preliminary state estimation value calculation unit 42 calculates a preliminary state of the state variable based on the weight and the sigma point. For example, an average state of charge of the battery modules 16 is calculated by reflecting the weights on the states of charge SOC0 to SOCn of the battery modules 16.

The output sigma point calculation unit 43 calculates an output estimated from a plurality of sigma points. For example, the states of charge SOC0 to SOCn of the battery assembly 15 are calculated based on the states of charge of the battery modules 16 corresponding to the sigma points, and voltages estimated for the battery modules 16 are calculated from the states of charge SOC0 to SOCn of the battery assembly 15.

The preliminary output estimation value calculation unit 44 calculates a preliminary output from a plurality of sigma points.

The preliminary output error covariance matrix calculation unit 45 calculates a preliminary output error covariance matrix from a plurality of sigma points.

The preliminary state/output error covariance matrix calculation unit 46 calculates a preliminary state/output error covariance matrix from a plurality of sigma points.

The Kalman gain calculation unit 47 calculates the Kalman gain from the preliminary output error covariance matrix and the preliminary state/output error covariance matrix.

Estimation of Battery State

The battery state estimation process will now be described with reference to FIGS. 4 to 8.

First, an outline of the battery state estimation process will be described with reference to FIG. 4. Before the battery state estimation process, the battery model 50 is acquired from the memory 27 and is set to be usable by the state estimation unit 25 (battery model setting step).

The battery state estimation process starts as necessary. As the battery state estimation process starts, the state representative value setting unit 40 performs an initial state setting process (step S10 of FIG. 4).

Figure 5:
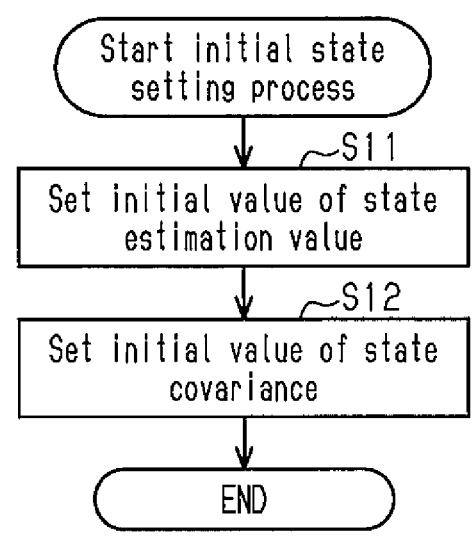
FIG. 5 is a flowchart illustrating a sequence of an initial state setting process according to the embodiment.

As illustrated in FIG. 5, in the initial state setting process, an initial value is set in the state estimation value (step S11 of FIG. 5), and an initial value is set in the state covariance matrix (step S12 of FIG. 5). The initial value of the state estimation value is set based on Equation (5), and the initial value of the state covariance matrix is set based on Equation (6). For example, the state of charge SOCpack of the battery assembly 15 is set as "$x_0$".

Equation 5

$$\hat{x}(0) = x_0 \quad (5)$$

Equation 6

$$P(0) = E((x(0)-E(x(0)))\cdot(x(0)-E(x(0)))^T) = \Sigma_0 \quad (6)$$

Figure 4:
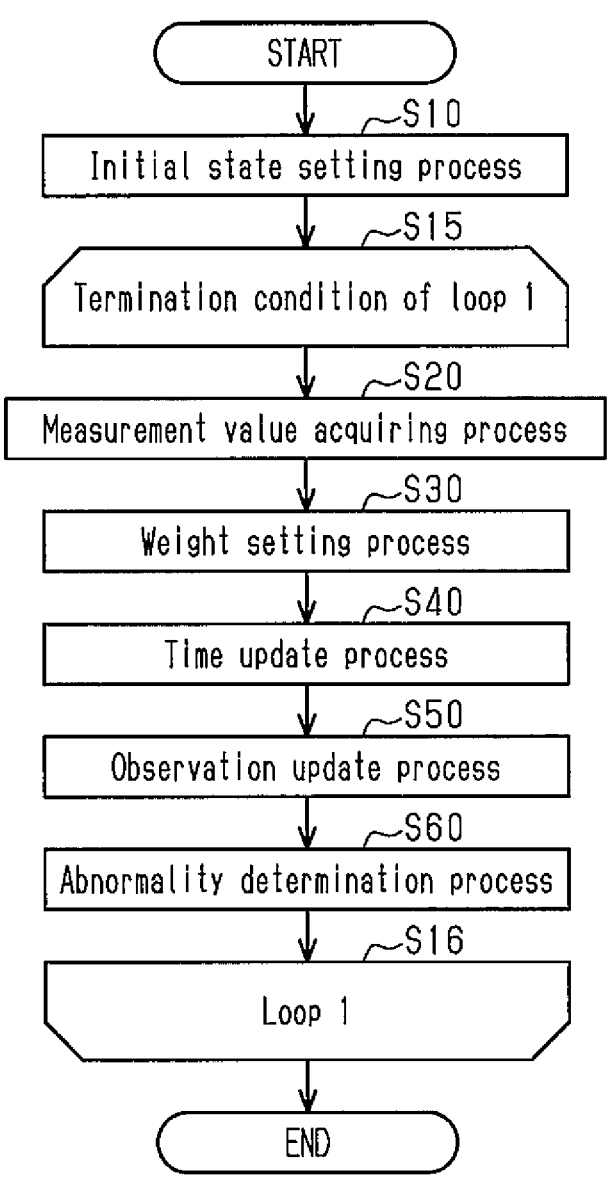
FIG. 4 is a flowchart illustrating an estimation sequence of a battery state of a battery assembly according to the embodiment.

As illustrated in FIG. 4, when the initial state setting process is terminated, the time update processing unit 33 determines a termination condition at the start of "Loop 1" (step S15 in FIG. 4). "Loop 1" is a process of repeating the process between the start (step S15 of FIG. 4) and the termination (step S16 of FIG. 4) until the termination condition of "Loop 1" is satisfied. The termination condition of "Loop 1" includes detection of an instruction signal for terminating the estimation process or the like. If it is determined that the termination condition is satisfied at the start of "Loop 1", the initial state setting process is terminated from when "Loop 1" is terminated (step S16 of FIG. 4). If it is determined that the termination condition is not satisfied at the start of "Loop 1", the process advances to step S20 of "Loop 1" from the start of "Loop 1".

The battery information acquiring unit 31 performs a measurement value acquiring process for acquiring measurement values of the input/output current Ip, the voltages V0 to Vn, and the temperatures T0 to Tn (step S20 of FIG. 4: battery information acquiring step).

Next, the weight setting unit 32 performs a weight setting process (step S30 of FIG. 4).

Figure 6:
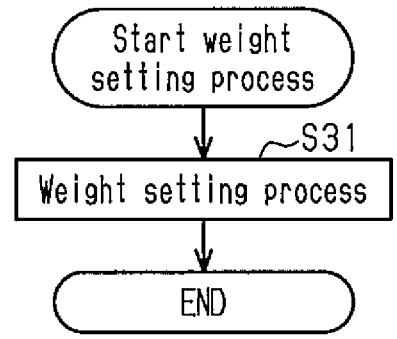
FIG. 6 is a flowchart illustrating a sequence of a weight setting process according to the embodiment.

As the weight setting process (step S30 of FIG. 4) starts as illustrated in FIG. 6, the weight is set (step S31 of FIG. 4). In the weight setting, the weight co, calculated by the weight setting unit 32 is set for estimation value calculation.

Next, as illustrated in FIG. 4, the time update processing unit 33 performs a time update process (step S40 of FIG. 4: battery state estimation step).

Figure 7:
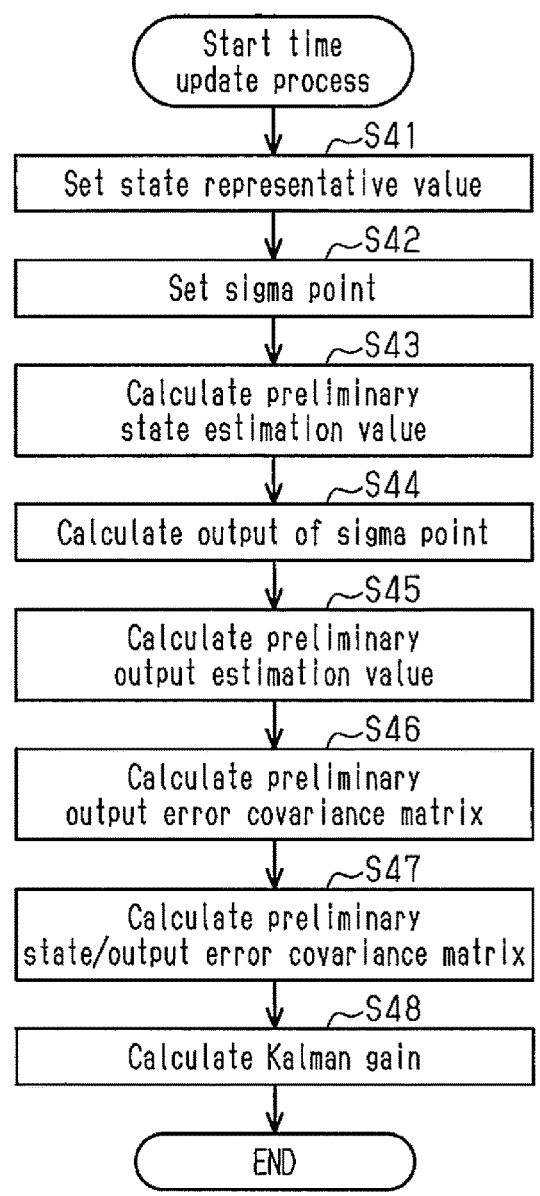
FIG. 7 is a flowchart illustrating a sequence of a time update process according to the embodiment.

As illustrated in FIG. 7, when the time update process starts, the state representative value setting unit 40 performs a state representative value setting process (step S41 of FIG. 7). The state representative value is set based on Equation (7). For example, an input is the voltage V0 of the representative value, and the state variable is the state of charge SOCpack of the battery assembly 15 estimated from the voltage V0 of the representative value. The representative value of the left side is the state of charge SOCpack of the battery assembly 15 prior to the updating based on the voltage V0 of the representative value.

Equation 7

$$\hat{x}_0^-(k) = f(\hat{x}(k-1), u_0(k-1)) \quad (7)$$

Subsequently, the sigma point setting unit 41 performs a sigma point setting process (step S42 of FIG. 7). The sigma point other than the representative value is set based on Equation (8). For example, the sigma point other than the representative value includes the states of charge SOC1 to SOCn of the battery assembly 15 prior to the updating based on the voltages V1 to Vn of the battery modules 16_1 to 16_n.

Equation 8

$$\sigma_i^-(k) = f(\hat{x}(k-1), u_i(k-1)) \, i=1,2,3,\ldots,^{n(n=Number\ of\ Measurements)} \quad (8)$$

The preliminary state estimation value calculation unit 42 calculates a preliminary state estimation value (step S43 of FIG. 7). The preliminary state estimation value is calculated based on Equation (9). For example, a preliminary state of charge (average) of the battery assembly 15 is estimated (calculated) by applying weights to the states of charge SOC0 to SOCn of the battery assembly 15. Here, "1" refers to an integer equal to or greater than Equation 9

$$\hat{x}^-(k) = \Sigma_{i=0}^n \omega_i \sigma_i^-(k) \quad (9)$$

The output sigma point calculation unit 43 calculates an output based on the sigma point (step S44 of FIG. 7). That is, an output estimated based on Equations (10) and (11) and the sigma point is calculated. For example, estimated voltages of the battery modules 16_0 to 16_n serving as a basis of the estimation are output based on each estimated states of charge SOC0 to SOCn of the battery assembly 15. In other words, the estimated voltages of the battery modules 16_0 to 16_n are output based on the corresponding states of charge SOC0 to SOCn of the battery assembly 15.

Equation 10

$$\varphi_0^-(k) = h(\hat{x}_0(k)) \quad (10)$$

Equation 11

$$\varphi_i^-(k) = h(\sigma_i^-(k)) \quad (11)$$

Then, the preliminary output estimation value calculation unit 44 calculates a preliminary output estimation value (step S45 of FIG. 7). That is, the preliminary output is estimated based on Equation (12) and the sigma point. For example, an average value of the estimated voltages of the battery modules 16_0 to 16_n is calculated.

Equation 12

$$\hat{y}^-(k) = \Sigma_{i=0}^n \omega_i \varphi_i^-(k) \quad (12)$$

Subsequently, the preliminary output error covariance matrix calculation unit 45 calculates a preliminary output error covariance matrix (step S46 of FIG. 7). That is, the preliminary output error covariance matrix is calculated based on Equation (13) and the sigma point. For example, the preliminary output error covariance matrix is calculated based on differences between the estimated voltages of the battery modules 16_0 to 16_n and an average voltage of the voltages.

Equation 13

$$P_{yy}^-(k) = \Sigma_{i=0}^n \omega_i (\varphi_i(k) - \hat{y}^-(k))^2 \quad (13)$$

The preliminary state/output error covariance matrix calculation unit 46 calculates a preliminary state/output error covariance matrix (step S47 of FIG. 7). That is, the preliminary state/output error covariance matrix is calculated based on Equation (14) and the sigma point. For example, the preliminary state/output error covariance matrix is calculated based on a difference between the sigma point and the preliminary state of charge (average value) of the battery assembly 15 and differences between the estimated voltages of the battery modules 16_0 to 16_n and an average value of the estimated voltages of the battery modules 16_0 to 16_n.

Equation 14

$$P_{xy}(k) = \Sigma_{i=0}^n \omega_i (\sigma_i^-(k) - \hat{x}^-(k))(\varphi_i^-(k) - \bar{y}^-(k))^T \quad (14)$$

Then, the Kalman gain calculation unit 47 calculates the Kalman gain (step S48 of FIG. 7). That is, the weight applied for calculation of the state estimation value in Equation (16) below is calculated based on Equation (15).

Equation 15

$$g(k) = \frac{P_{xy}^-(k)}{P_{yy}^-(k) + w_k^2} \quad (15)$$

In addition, when the Kalman gain is calculated, the time update process is terminated, and the battery state estimation process advances to the next step.

As illustrated in FIG. 4, the observation update processing unit 34 performs an observation update process (step S50 of FIG. 4). In the observation update process, the state estimation value is updated based on Equation (16). For example, the updated state of charge SOC is calculated from the preliminary state of charge SOC of the battery assembly 15.

Equation 16

$$\hat{x}(k) = \hat{x}^-(k) + g(k)(y(k) - \hat{y}^-(k)) \quad (16)$$

Here, considering the Kalman gain "g(k)" of Equation (16) as a correction value for the state variable "x(k)", it is possible to detect abnormality of the battery assembly based on a magnitude of the correction amount. In addition, if the output function "h" is a vector, the Kalman gain "g(k)" is also a vector. Therefore, it is possible to detect a variation of the correction value, that is, a variation in the battery states (state of charge SOC) of a plurality of battery modules 16. For example, each of the estimated states of charge SOC1 to SOCn of the battery assembly 15 correlates with the state of charge SOC of the corresponding battery module 16. For this reason, the Kalman gain "g(k)" can be used to determine a variation generated in the battery state (state of charge SOC) or the battery information (voltage) of each battery module 16.

Subsequently, the abnormality determination unit 35 performs an abnormality determination process (step S60 of FIG. 4). The abnormality determination unit 35 at least determines a variation of the Kalman gain "g(k)" or a variation of the error covariance matrix Pxx.

For example, the abnormality determination unit 35 compares the Kalman gain "g(k)" with the first variation determination value for determining the variation. If the magnitude of the Kalman gain "g(k)" is larger than that of the first variation determination value, the abnormality determination unit 35 determines that the variation is large. In contrast, if the magnitude of the Kalman gain "g(k)" is smaller than or equal to the first variation determination value, the abnormality determination unit 35 determines that the variation is not large (normal). If the Kalman gain is a scalar value, the first variation determination value may be a scalar value. If the Kalman gain is a matrix, the first variation determination value may be either a matrix or a scalar value.

For example, the abnormality determination unit 35 compares the error covariance matrix Pxx with a second variation determination value for determining the variation. If the magnitude of the error covariance matrix Pxx is larger than the second variation determination value, the abnormality determination unit 35 determines that the variation is large. In contrast, if the magnitude of the error covariance matrix Pxx is smaller than or equal to the second variation determination value, the abnormality determination unit 35 determines that the variation is not large (normal).

Figure 8:
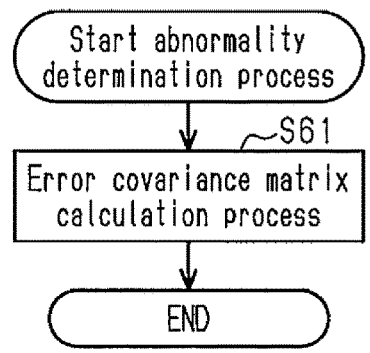
FIG. 8 is a flowchart illustrating a sequence of an abnormality determination process according to the embodiment.

Specifically, as illustrated in FIG. 8, when the abnormality determination process (step S60 of FIG. 4) starts, the abnormality determination unit 35 performs an error covariance matrix calculation process (step S61 of FIG. 8). The error covariance matrix is a matrix calculated by comparing the representative battery module 16 with the other battery modules 16 based on Equation (17).

Equation 17

$$P_{xx}(k) = \Sigma_{i=1}^n \omega_i^-(k-1) - \hat{x}_0^-(k-1))(\sigma_i^-(k) - \hat{x}_0^-(k))^T \quad (17)$$

The abnormality determination unit 35 can detect an increase or decrease of the variation between a plurality of battery modules 16 based on the value of the error covariance matrix Pxx. In addition, the abnormality determination unit 35 can detect that the variation increases if the value of the error covariance matrix Pxx is larger than the second variation determination value.

The abnormality determination unit 35 may detect an abnormality in the measurement system. In the battery state estimation process, the first estimation result based on the sigma point automatically obtained from Equations (3) and (4) can be calculated by performing UKF computation using the sigma point. In addition, it is possible to calculate a second estimation result based on the sigma point by allocating the measurement value from the battery assembly 15. Furthermore, by obtaining a difference between the first and second estimation results calculated in this manner, it can be detected that an abnormality is generated in the measurement system that measures a measurement value from the battery assembly 15 if the obtained difference is larger than or equal to a predetermined value.

Operation

According to this embodiment, the sigma point setting unit 41 sets the state of charge SOC0 of the battery assembly 15 estimated based on a selected battery module 16_0 as a representative value, and regards the states of charge SOC1 to SOCn of the battery assembly 15 estimated based on the other battery modules 16_1 to 16_n as being close to the representative value. In addition, the sigma point setting unit 41 sets the states of charge SOC0 to SOCn of the battery assembly 15 estimated based on the battery modules 16_0 to 16_n as the sigma points. Therefore, a transition of the battery state of the battery assembly 15 is computed from actual measurement values from the battery modules 16_0 to 16_n. Therefore, it is desirable that the accuracy be improved.

Since the battery state of the battery assembly 15 estimated from the actual measurement values of the battery modules 16_0 to 16_n is the sigma point, it is possible to reduce a work load of the sigma point calculation process.

According to this embodiment, the state variable includes a plurality of battery states (states of charge SOC0 to SOCn) calculated according to a total number of battery modules. That is, the battery state of the battery assembly 15 is estimated by reflecting the battery information or the battery state of each battery module 16. In other words, since the battery state of the battery assembly 15 includes battery information of each battery module 16, it is possible to improve the estimation accuracy of the battery state as compared to a case where the battery state is estimated based on one piece of the battery information of the battery assembly 15 acquired from the battery assembly 15.

The battery assembly state estimation device and the battery assembly state estimation method of the above embodiment have the advantages described below.

(1) The battery state of the battery assembly 15 is obtained from the battery states of the battery modules 16 included in the battery assembly 15. When the battery assembly 15 is used, it is desirable that the battery state of the battery assembly be obtained as a unit. In addition, since the battery state of the battery assembly 15 is estimated by using each piece of battery information of the individual battery module 16, a computation for individually estimating the battery states of a plurality of battery modules 16 is not necessary. Furthermore, since the battery state of the battery assembly 15 is estimated from the battery information of each battery module 16, the accuracy of the calculated battery state of the battery assembly 15 is also high. As a result, it is possible to accurately estimate the battery state of the battery assembly 15 with a small computation load.

(2) Since each piece of the battery information of all of the battery modules 16 is set as a sigma point, it can be expected that the accuracy of the battery state estimated by the Kalman filter will be improved.

(3) Since the voltages V0 to Vn are used as the battery information, the battery state of the battery assembly 15 is estimated from the battery information including the voltages across terminals of the battery modules.

(4) It is possible to detect a variation generated in the battery state of a plurality of battery modules included in the battery assembly 15 based on the Kalman gain.

(5) It is possible to detect a variation generated in the battery state of a plurality of battery modules included in the battery assembly 15 based on the error covariance matrix.

(6) Since the measurement value of the battery module 16 is used, the initial value of the state variable is easily selected. In addition, there is a high probability that a suitable initial value of the state variable will be selected even for the state variable.

(7) Upon calculation of the Kalman gain, the battery state influencing on the sigma point which is to be emphasized by setting the weight $\omega i$ is emphasized.

The above embodiment may be modified as described below.

The weight may be set according to the ambient environment of the battery pack 10 or the environment of the battery module 16 inside the battery pack 10 instead of the temperature. For example, the weight may be set according to an arrangement position of the battery module 16 inside the battery assembly 15. In the battery assembly 15 in which a plurality of battery modules 16 are stacked, the heat dissipation effect of the battery module 16 tends to be high at both ends and tends to be low in the central part in the stacking direction. In addition, the battery module 16 may regulate battery performance of the battery assembly 15 if the temperature is higher than a reference value. In contrast, the battery module 16 may regulate the battery performance of the battery assembly 15 if the temperature is lower than the reference value.

In this regard, in a case where the battery assembly 15 is placed under an environment having a temperature higher than the reference value, it is highly likely that the battery performance is regulated by the battery module 16 placed in the central part where the temperature easily increases. Therefore, the weights are set such that the weight for the battery information or the battery state of the battery module 16 close to the central part is relatively high. That is, a magnitude relationship of the weight is set to "central part>ends".

In contrast, in a case where the battery assembly 15 is placed under a temperature environment lower than the reference value, it is highly likely that the battery performance is regulated by the battery modules 16 at both ends where the temperature easily decreases. For this reason, the weights are set such that the weight for the battery information or the battery state of the battery module 16 close to both ends is relatively high. That is, a magnitude relationship of the weight is set to "central part<ends".

Such an arrangement takes into consideration that the temperature easily decreases in the battery module of the battery assembly located at the end and that the temperature easily increases in the battery module located at the central part. In addition, it is possible to set the weight by taking into consideration that the battery performance of the battery assembly is easily regulated when the battery module has a low temperature in a low temperature environment and when the battery module has a high temperature in a high temperature environment.

The weight may be set by focusing on an internal resistance of the battery module 16 or the state of charge SOC. Alternatively, the weight may be set by focusing on a plurality of pieces of battery information or battery states as well as a single piece of battery information or battery state.

The above embodiment exemplifies a case where the state of charge SOC0 of the battery assembly 15 based on the battery module 16_0 is set as the representative value. However, the abnormality determination unit may determine that the variation of the battery state is large when the battery state estimation unit determines the variation by selecting one of the sigma points as the representative value. In this case, the battery state of the battery assembly may be estimated again by selecting a sigma point other than the selected representative value as a new representative value.

As a result, when battery information of a plurality of battery modules is used for estimating the battery state, estimation of the battery state using the Kalman filter is performed based on more suitable battery information by substituting the battery state defined once as the representative value of the Kalman filter with the battery state of another battery module.

The above embodiment exemplifies a case where the representative value is the state of charge SOC0 of the battery assembly 15 based on the battery module 16_0. However, the representative value may be another type of value set based on a value calculated from the battery module such as a state of charge of the battery assembly estimated from a plurality of battery modules, an average state of charge of a plurality of states of charge of the battery assembly estimated based on a plurality of battery modules, or the like.

A value based on the battery information of any rechargeable battery of the battery modules 16_0 to 16_$n$ may be set for a plurality of sigma points.

Any battery state may be set for the sigma point. For example, a battery state includes at least one of the SOC, the current, the voltage across terminals, or the temperature.

The above embodiment exemplifies a case where the SOCs of all the battery modules 16 are allocated to a plurality of sigma points. However, battery information of some of the battery modules may be allocated to a plurality of sigma points. In addition, battery information of the respective battery modules may be allocated to some of a plurality of sigma points. Furthermore, the battery information of some of the battery modules may be allocated to none of the sigma points.

The battery state of the battery assembly 15 estimated based on a plurality of battery modules 16 may be allocated to a single the sigma point.

The above embodiment exemplifies a case where one piece of the battery information (such as current, voltage, and temperature) is acquired from a single battery module 16. However, one piece of battery information may be acquired from a plurality of battery modules.

The above embodiment exemplifies a case where the rechargeable battery is a battery module. However, the rechargeable battery may be a unit cell. For example, the battery assembly may include a plurality of unit cells.

The above embodiment exemplifies a case where the battery state of the battery assembly is estimated. However, the battery state of the battery module including a plurality of unit cells may also be estimated.

The state variable (vector) of the battery assembly 15 may include at least one of voltage, current, temperature, state of health (SOH: deteriorated state), state of power (SOP: charge/discharge capability), a parameter that can be modeled, and the like, in addition to the SOC.

The input vector "u(k)" may include at least one of the current, voltage, and temperature measurable from the battery module 16, any parameter, and any parameter calculable through computation or the like.

The state variable "x(k)" may include at least one of the state of charge SOC, current, voltage, and temperature computable for the battery assembly 15, any parameter, and any parameter calculable through computation or the like.

The output vector "y(k)" may include at least one of the state of charge, current, voltage, temperature, and the like of the battery module 16.

The above embodiment exemplifies a case where the optimum filter is an unscented Kalman filter of the nonlinear Kalman filter. However, the optimum filter may be any filter as long as state estimation can be performed in a state equation using the sample point distribution state. For example, an ensemble KF (EnKF) or a particle filter (PF) may be employed.

The above embodiment exemplifies a case where the battery module 16 is a box-shaped sealed battery. However, the battery module may have any shape other than that of a box such as a cylindrical shape or a cubic shape.

The above embodiment exemplifies a case where the battery module 16 is a lithium-ion rechargeable battery or a nickel-metal hydride rechargeable battery. However, without limiting thereto, other types of rechargeable batteries may also be employed.

The above embodiment exemplifies a case where the battery assembly 15 is included in the battery pack 10 and is mounted on a hybrid vehicle or the like as a power source. However, without limiting thereto, the battery assembly may also be used as a power source of any element such as various mobile or fixed members other than a vehicle as long as it is used as a power source.

The invention claimed is:

1. A state estimation device for a battery assembly including a plurality of rechargeable batteries, the state estimation device comprising:
a battery information acquiring unit configured to acquire battery information of each of the rechargeable batteries;
a memory configured to store a battery model of the battery assembly including the battery information of a rechargeable battery; and
a battery state estimation unit configured to estimate a battery state of the battery assembly based on the battery information of each of the rechargeable batteries acquired by the battery information acquiring unit and the battery model of the battery assembly, wherein
the battery state estimation unit receives the battery information of each of the rechargeable batteries acquired by the battery information acquiring unit,
the battery state estimation unit estimates the battery state of the battery assembly based on the received battery information of each of the rechargeable batteries,
the battery state estimation unit uses the estimated battery states of the battery assembly as a state variable and applies an optimum filter for performing optimization based on a distribution of a plurality of sample points to a state equation and an output equation included in the battery model to calculate a gain for correcting the state variable, and
the battery state estimation unit successively estimates the battery state of the battery assembly using the calculated gain,
each of the sample points is associated with one of the rechargeable batteries, and
each of the sample points is allocated the battery state of the battery assembly estimated from the battery information of the associated rechargeable battery.

2. The state estimation device according to claim 1, wherein the sample points are associated with all of the rechargeable batteries.

3. The state estimation device according to claim 1, wherein the battery information of each of the rechargeable batteries includes at least one of a voltage across terminals of the rechargeable battery, a temperature of the rechargeable battery, and a current of the rechargeable battery.

4. The state estimation device according to claim 1, wherein the state estimation device further comprising:
a variation determination unit configured to determine a magnitude of variation in the battery states of the battery assembly, wherein the variation determination unit determines the magnitude of the variation by comparing the gain with a first variation determination value for determining variation.

5. The state estimation device according to claim 1, wherein the state estimation device further comprising:
a variation determination unit configured to determine a magnitude of variation in the battery states of the battery assembly, wherein the variation determination unit determines the magnitude of the variation by comparing an error covariance matrix calculated based on the optimum filter with a second variation determination value for determining variation.

6. The state estimation device according to claim 4, wherein when one of the sample points is selected as a representative value and the variation determination unit determines that the variation is large, the battery state estimation unit estimates the battery state of the battery assembly again by selecting a sample point other than the sample point corresponding to the selected representative value as a new representative value.

7. The state estimation device according to claim 1, wherein the battery state estimation unit sets an initial value of the state equation to the battery state of the battery assembly estimated from the battery information of one of the rechargeable batteries.

8. The state estimation device according to claim 1, wherein:
the battery state estimation unit sets, for each of the sample points, a weight adjusted in accordance with the battery state of the battery assembly estimated from the battery information of each of the rechargeable batteries; and
the battery state estimation unit calculates the gain based on the set sample points.

9. The state estimation device for the battery assembly according to claim 8, wherein the battery state estimation unit adjusts a relative magnitude relationship between a weight applied to a rechargeable battery located at an end of the battery assembly with respect to a longitudinal direction of the battery assembly and a weight applied to a rechargeable battery located at a central part of the battery assembly with respect to the longitudinal direction in accordance with an ambient environment of the battery assembly.

10. The state estimation device according to claim 1, wherein
the optimum filter is an unscented Kalman filter,
the sample points are sigma points, and
the gain is a Kalman gain.

11. A method for estimating a state of a battery assembly including a plurality of rechargeable batteries, the method comprising:
acquiring battery information of each of the rechargeable batteries from the rechargeable batteries with a battery information acquiring unit;
storing a battery model of the battery assembly including the battery information of a rechargeable battery in a memory; and
estimating a battery state of the battery assembly based on the battery information of each of the rechargeable batteries, which is acquired by the battery information acquiring unit, and the battery model of the battery assembly with a battery state estimation unit, wherein the estimating a battery state of the battery assembly includes
receiving the battery information of each of the rechargeable batteries acquired by the battery information acquiring unit,
estimating the battery state of the battery assembly based on the received battery information of each of the rechargeable batteries,
using the estimated battery states of the battery assembly as a state variable and applying an optimum filter for performing optimization based on a distribution of a plurality of sample points to a state equation and an output equation included in the battery model to calculate a gain for correcting the state variable, and
successively estimating the battery state of the battery assembly with the calculated gain;
wherein each of the sample points is associated with one of the rechargeable batteries, and
each of the sample points is allocated the battery state of the battery assembly estimated from the battery information of the associated rechargeable battery.

* * * * *